United States Patent
Götz et al.

(10) Patent No.: US 8,798,109 B2
(45) Date of Patent: Aug. 5, 2014

(54) HIGH-EFFICIENCY DIODE LASER

(75) Inventors: Erbert Götz, Löbau (DE); Hans Wenzel, Berlin (DE); Paul Crump, Berlin (DE)

(73) Assignee: Forschungsverbund Berlin E.V., Berlin (DE)

( * ) Notice: Subject to any disclaimer, the term of this patent is extended or adjusted under 35 U.S.C. 154(b) by 0 days.

(21) Appl. No.: 13/978,222

(22) PCT Filed: Dec. 28, 2011

(86) PCT No.: PCT/EP2011/074133
§ 371 (c)(1),
(2), (4) Date: Jul. 3, 2013

(87) PCT Pub. No.: WO2012/097947
PCT Pub. Date: Jul. 26, 2012

(65) Prior Publication Data
US 2013/0287057 A1     Oct. 31, 2013

(30) Foreign Application Priority Data

Jan. 20, 2011 (DE) .......................... 10 2011 002 923

(51) Int. Cl.
*H01S 5/10* (2006.01)
(52) U.S. Cl.
USPC ............... 372/43.01; 372/45.01; 372/50.1
(58) Field of Classification Search
CPC ....... H01S 5/20; H01S 5/2018; H01S 5/2031; H01S 5/3013; H01S 5/3213; H01S 2301/18
USPC ..................... 372/43.01; 271/43.01
See application file for complete search history.

(56) References Cited

U.S. PATENT DOCUMENTS

| | | | |
|---|---|---|---|
| 5,606,176 A * | 2/1997 | Nitta | 257/18 |
| 2007/0002914 A1 | 1/2007 | Ryu et al. | |
| 2010/0150196 A1 * | 6/2010 | Rossin | 372/45.012 |
| 2012/0093187 A1 | 4/2012 | Koeth et al. | |

FOREIGN PATENT DOCUMENTS

| | | |
|---|---|---|
| DE | 10 2009 019996 A1 | 12/2010 |
| WO | 2009/144376 A1 | 3/2009 |

OTHER PUBLICATIONS

International Search Report mailed May 29, 2012.
Translation of International Search Report mailed May 29, 2012.

\* cited by examiner

*Primary Examiner* — Xinning Niu
(74) *Attorney, Agent, or Firm* — Norris McLaughlin & Marcus P.A.

(57) ABSTRACT

A laser diode has a first n-conducting cladding layer, a first n-conducting waveguide layer arranged therein, an active layer is suitable for generating radiation arranged on the first waveguide layer, a second p-conducting waveguide layer, arranged on the active layer, and a second p-conducting cladding layer, arranged on the second waveguide layer the sum of the layer thickness of the first waveguide layer, the layer thickness of the active layer and the layer thickness of the second waveguide layer is greater than 1 μm and the layer thickness of the second waveguide layer is less than 150 nm. The maximum mode intensity of the fundamental mode is in a region outside the active layer, and the difference between the refractive index of the first waveguide layer and the refractive index of the first cladding layer is between 0.04 and 0.01.

13 Claims, 11 Drawing Sheets

HIGH-EFFICIENCY DIODE LASER

This application is a 371 application of PCT/EP2011/074133 filed Dec. 28, 2011, which claims foreign priority benefit under 35 U.S.C. §119 of Germany Patent application 10 2011 002 923.0 filed Jan. 20, 2011.

The present invention relates to a high-efficiency diode laser.

PRIOR ART

In general, edge-emitting laser diodes (diode lasers) have an active layer embedded in semiconductor layers that differ from each other with respect to their band gaps, refractive indices and doping. The layers arranged below and above the active layer differ from each other with respect to their modes of conductivity (n or p). Said layers serve to ensure the transport of electrons and holes to the active layer, where they perform stimulated recombination and generate laser irradiation, as well as to guide the laser light vertically. The layers arranged adjacent to the active layer are referred to as waveguide layers and the layers arranged adjacent to the waveguide layers are referred to as cladding layers. Typically, the refractive index of the active layer is higher than that of the waveguide layers and the refractive index of the waveguide layers is higher than that of the cladding layers. However, other configurations (e.g., Vertical ARROW, Photonic Band Crystal) are possible as well.

FIG. 1 shows the distribution of refractive indices along the layers of a conventional laser diode and the vertical distribution of mode intensity related thereto. Such a conventional laser diode is known from, e.g., Schultz et al. "11W broad area 976 nm DFB lasers with 58% power conversion efficiency" Electron. Lett., vol 46, No. 8, pp 580-581 (2010). The laser diode has a vertical layer structure with an n-conducting cladding layer nMS, an n-conducting waveguide layer nWL arranged on the cladding layer nMS, a comparatively thin active layer arranged on the waveguide layer nWL, a p-conducting waveguide layer pWL arranged on the active layer, and a p-conducting cladding layer pMS arranged on the waveguide layer pWL. Outside said layers, further layers (such as carrier substrate or contact layers) may be provided. For more clarity, said further layers are not shown. The waveguide layers and cladding layers of said structure have the following non-reactive resistance values: n-conducting cladding layer nMS 0.3 mΩ, n-conducting waveguide layer nWL 1.4 mΩ, p-conducting waveguide layer pWL 17.1 mΩ, and p-conducting cladding layer pMS 0.7 mat. Furthermore, the waveguide layers and cladding layers of said structure have the following optical loss values: n-conducting cladding layer nMS 0.02 $cm^{-1}$, n-conducting waveguide layer nWL 0.12 $cm^{-1}$, p-conducting waveguide layer pWL 0.29 $cm^{-1}$, and p-conducting cladding layer pMS 0.02 $cm^{-1}$. Conventionally, optical loss and non-reactive resistance are thus dominated by the p-conducting waveguide layer pWL.

The provision of a slightly asymmetrical waveguide in order to reduce the significant influence of the p-conducting waveguide layer on optical loss and non-reactive resistance is known. By means of said slightly asymmetrical waveguide, the energy of the developing (fundamental) mode is shifted to the n-conducting side. For example, the provision of one or several additional layers having a comparatively high refractive index in the n-conducting cladding layer or in the n-conducting waveguide layer is known from, inter alia, U.S. Pat. No. 6,987,788 B2 and Corbett, Electron. Lett., vol 38, pp 515-516 (2002). Furthermore, the provision of an asymmetry between p-conducting waveguide and cladding layers and n-conducting waveguide and cladding layers is known from Bogatov et al. Quantum Electronics 38 (19), pp 935-939 (2008).

However, a disadvantage of the aforementioned laser diodes consists in the fact that non-reactive resistance is not reduced sufficiently and undesirable higher-order vertical modes are not suppressed sufficiently. In the aforementioned laser diodes, the intensity of the fundamental mode is at its maximum always in the active layer so that there is a high lower limit to the attainable minimum of optical loss/the attainable minimum of non-reactive resistance.

DISCLOSURE OF THE INVENTION

Therefore, the object of the present invention is to specify a diode laser with high efficiency, low optical loss and low non-reactive resistance. Furthermore, it should be possible to produce the laser diode according to the invention inexpensively.

According to the invention, these objects are achieved by the features of Patent Claim 1. Useful realizations of the invention are included in the subclaims.

The idea of the present invention consists in providing a diode laser with low optical loss and low non-reactive resistance, wherein the layer thickness of the p-conducting waveguide layer is less than 150 nm, preferably less than 100 nm, whereas overall waveguide thickness (sum of the layer thickness of the p-conducting waveguide layer and the layer thickness of the n-conducting waveguide layer) is greater than 1 μm. In this way, the maximum mode intensity of the fundamental mode can be shifted to a region outside the active layer, preferably to a weakly doped region of the n-conducting waveguide layer. Furthermore, by using an advantageous design of the n-conducting cladding layer and the n-conducting waveguide layer with a refractive-index difference of less than 0.04, it is possible to suppress or completely eliminate undesirable higher-order vertical modes in spite of the maximum mode intensity of the fundamental mode shifted out of the active layer.

The diode laser according to the invention has a first n-conducting cladding layer, a first n-conducting waveguide layer, which is (directly) arranged on the first cladding layer, an active layer, which is suitable for generating radiation and which is (directly) arranged on the first waveguide layer, a second p-conducting waveguide layer, which is (directly) arranged on the active layer, and a second p-conducting cladding layer, which is (directly) arranged on the second waveguide layer, wherein, according to the invention, the layer thickness of the second waveguide layer is less than 150 nm. In a preferred embodiment, the layer thickness of the second waveguide layer is between 3 and 150 nm, whereby an electron wave in the active layer can be efficiently kept away from the cladding layer. In a particularly preferred embodiment, the layer thickness of the second waveguide layer is between 5 and 100 nm, more preferably between 5 and 60 nm.

On account of the small layer thickness of the second waveguide layer, low optical loss and low non-reactive resistance are attainable.

Preferably, the difference (Δn) between the refractive index of the first waveguide layer and the refractive index of the first cladding layer is less than 0.05, which makes the advantageous suppression or complete elimination of higher-order modes possible. The difference between the refractive indices must be such that during active operation, thermally and electronically induced refractive-index changes (typically less than 0.01) have no influence on laser properties. In a particularly preferred embodiment, the difference (Δn)

between the refractive index of the first waveguide layer and the refractive index of the first cladding layer is between 0.045 and 0.005, more preferably between 0.04 and 0.01, and even more preferably between 0.04 and 0.015. The refractive index refers to the central wavelength of the radiation emitted by the active layer. The central wavelength of the radiation emitted by the active layer is preferably between 380 nm and 10 μm, more preferably between 380 and 1200 nm, and even more preferably between 700 and 1000 nm.

Preferably, the sum of the layer thickness of the first waveguide layer, the layer thickness of the active layer and the layer thickness of the second waveguide layer is greater than 1 μm. By this realization, an acceptable vertical far field in an angle of less than 50° can be attained for the fundamental mode. Within said vertical far field, 95% of the radiant power are included or are radiated (FF95%). Furthermore, the fundamental mode is stable against temperature effects or charge carrier effects (i.e., mainly defined by waveguide layers and cladding layers). Furthermore, a small proportion of the fundamental mode within the p-conducting waveguide layer (preferably <15%, e.g., with p-conducting waveguide layer of 150 nm and overall thickness of 1.15 μm) results in a loss that is as low as possible. Moreover, the proportion of the fundamental mode in the active layer is small with respect to maximum power, i.e., the fundamental mode is not centrally arranged in the active layer, which results in low losses.

Preferably, the layer thickness of the first cladding layer is greater than 1 μm, more preferably greater than 1.2 μm, even more preferably greater than 1.4 μm, even more preferably greater than 1.6 μm, and more preferably greater than 1.8 μm. The layer thickness of the first cladding layer is only limited by practical growth conditions. It is possible to use the whole substrate as a first cladding layer.

Preferably, the ratio that the layer thickness of the first cladding layer bears to the layer thickness of the first waveguide layer is greater than 1.0, more preferably greater than 1.2, even more preferably greater than 1.4, even more preferably greater than 1.5, even more preferably greater than 1.6, even more preferably greater than 1.7, even more preferably greater than 1.8, even more preferably greater than 2.0, even more preferably greater than 2.5, and even more preferably greater than 3.5. By extending the first cladding layer in relation to the first waveguide layer, the fundamental mode is prevented from being decoupled into the substrate.

Preferably, a reflecting facet for reflecting the radiation emitted by the active layer and an exit facet for reflecting and decoupling the radiation emitted by the active layer are provided, wherein both the reflecting facet and the exit facet are arranged in the edge region of the active layer and wherein the reflecting facet and the exit facet are arranged opposite each other with respect to the active layer.

Preferably, the (overall) layer thickness of the active layer is less than 80 nm, more preferably less than 60 nm, more preferably less than 40 nm, and even more preferably less than 20 nm.

Preferably, the active layer has at least one quantum well without barrier layers. In an alternative preferred embodiment, the active layer has at least one well layer and at least two barrier layers. Preferably, the layer thickness of the at least one well layer is between 1 and 25 nm, more preferably between 5 and 20 nm. Preferably, the layer thicknesses of the at least one well layer are uniform and identical. Preferably, the layer thicknesses of the optionally present barrier layers are uniform and identical. Preferably, the number of the well layers is smaller than 15, even more preferably smaller than 10, more preferably smaller than 5, and even more preferably smaller than 3. Preferably, the overall layer thickness of the active layer (including all well layers and barrier layers) is less than 80 nm, more preferably less than 60 nm, more preferably less than 40 nm, and even more preferably less than 20 nm.

Preferably, the ratio $d/\Gamma$ that the sum of the thicknesses of the quantum wells bears to the optical confinement factor $\Gamma$ is less than 4 μm, more preferably less than 2 μm. The confinement factor is the ratio that the optical intensity in the quantum wells bears to overall optical intensity (see Visser et al. "Confinement and Modal Gain in Dielectric Waveguides", IEEE J. Lightwave Tech. Vol. 14, No. 5 pp. 885-887, 1996). Preferably, the diode laser is designed for continuous-wave mode. Preferably, the diode laser is electrically driven in such a manner that the diode laser operates in continuous-wave mode.

Preferably, the active layer is uniform. Preferably, the active layer is uniform over its entire length between the facets. Even more preferably, the active layer is uniform over its entire extension. According to the spirit of the present application, "uniformity of the active layer" means that over the mentioned extension, the layer parameters (such as chemical composition, doping, layer thickness, refractive index) deviate from each other (maximum relative to minimum) by less than 10%, even more preferably by less than 5%, even more preferably by less than 1%, and particularly preferably do not deviate from each other at all.

Preferably, the active layer extends over the entire region between the reflecting facet and the exit facet. Preferably, the active layer directly contacts both the reflecting facet and the exit facet. The active layer may also be spaced apart from the facets in a range between 0 and 500 μm (e.g., by using implantation, intermixing or overgrowth) in order to prevent a failure of the laser caused by destruction of the facet(s).

Preferably, the first cladding layer and the first waveguide layer are arranged on a first side of the active layer, and the second waveguide layer and the second cladding layer are arranged on a second, opposite side of the active layer.

Preferably, the diode laser is designed as an edge-emitting diode laser. Preferably, the diode laser is designed as an optical amplifier.

Preferably, the surfaces of the reflecting facet and of the exit facet are planar. Preferably, the surfaces of the reflecting facet and of the exit facet are arranged parallel to each other. Preferably, the longitudinal axis of the first waveguide layer and the longitudinal axis of the second waveguide layer extend perpendicular to the surfaces of the reflecting facet and of the exit facet. Preferably, a ribbed waveguide is provided for controlling the lateral far field.

Preferably, the waveguide layers according to the spirit of the present invention are those layers which directly adjoin the active layer on both sides. Preferably, the cladding layers according to the spirit of the present invention are those layers which directly adjoin the waveguide layers, each of said cladding layers facing away from the active layer.

Preferably, the waveguide layers and the cladding layers are uniform. Preferably, they are uniform over their entire length between the facets. Even more preferably, they are uniform over their entire extension. According to the spirit of the present application, "uniformity" means that over the mentioned extension, the layer parameters (such as chemical composition, doping, layer thickness, refractive index) deviate from each other (maximum relative to minimum) by less than 10%, even more preferably by less than 5%, even more preferably by less than 1%, and particularly preferably do not deviate from each other at all.

The material preferably used for the first cladding layer is AlGaAs, more preferably $Al_{0.20}Ga_{0.80}As$. Preferably, the layer thickness of the first cladding layer is between 1000 nm and 4000 nm. The material preferably used for the first waveguide layer is AlGaAs, more preferably $Al_{0.15}Ga_{0.85}As$. Preferably, the layer thickness of the first waveguide layer is between 500 nm and 1800 nm. All compound semiconductors consisting of elements of the third main group (Al, Ga, In) and of the fifth main group (N, P, As, Sb) of the periodic table of elements that generate the desired difference ($\Delta n$) between the refractive index of the first waveguide layer and the refractive index of the first cladding layer are suitable for use as materials for the first cladding layer and the first waveguide layer.

The refractive index of the first cladding layer is lower than the refractive index of the first waveguide layer. The refractive index of the second cladding layer is lower than the refractive index of the second waveguide layer.

The material preferably used for the active layer is an InGaAs MQW (multi quantum well), more preferably an InGaAs DQW (double quantum well). All compound semiconductors consisting of elements of the third main group (Al, Ga, In) and of the fifth main group (N, P, As, Sb) of the periodic table of elements are suitable for use as materials for the active layer, e.g., in the form of GaAsP, InGaAsP, AlInGaAs, InGaAsNSb. The material preferably used for the second waveguide layer is AlGaAs, preferably with an Al content that is as low as possible in order to attain a minimal electrical resistance, for 975 nm preferably <40%, more preferably <30%, more preferably <15% ($<Al_{0.15}Ga_{0.85}As$). Preferably, the layer thickness of the second waveguide layer is less than 150 nm, more preferably less than 100 nm, even more preferably less than 80 nm, and even more preferably less than 60 nm.

The material preferably used for the second cladding layer is AlGaAs, more preferably with an Al content sufficient to prevent the occurrence of leakage current, for 975 nm preferably >30%, even more preferably >40%, and even more preferably >60%, e.g., $Al_{0.85}Ga_{0.15}$ As. All compound semiconductors consisting of elements of the third main group (Al, Ga, In) and of the fifth main group (N, P, As, Sb) of the periodic table of elements are suitable for use as materials for the second cladding layer and the second waveguide layer.

Preferably, the layer thickness of the second cladding layer is between 10 µm and 50 nm, more preferably between 5 µm and 100 nm, and even more preferably between 2 µm and 200 nm.

Preferably, at least one of the two waveguide layers includes a refractive-index gradient (GRIN). If there is/are one or several waveguide layer(s) with a refractive-index gradient, the largest amount of the refractive index in the respective layer (with the refractive-index gradient) is always used to calculate the difference between the refractive index of a waveguide layer and the refractive index of an associated cladding layer. According to the present invention, a layer (waveguide layer) with a refractive-index gradient is a layer (waveguide layer) whose refractive index varies along the layer thickness axis (across the direction of light propagation). Preferably, the refractive index varies from a first value at the first junction (to the cladding layer) to a second value at the second junction (to the active layer). Preferably, the refractive index of a waveguide layer at the junction to the cladding layer is lower than at the junction to the active layer. Preferably, the refractive index infinitely varies from the junction to the cladding layer to the junction to the active layer. Preferably, the refractive-index gradient is generated by a composition profile in the semiconductor. For example, in the AlGaAs material system, the GRIN can be generated by a gradient of the aluminum content.

Provided that the second waveguide layer has a composition profile, AlGaAs having an aluminum content that is between $Al_{0.15}Ga_{0.85}As$ and $Al_{0.85}Ga_{0.15}As$ is preferably used.

Forming a refractive-index gradient in at least one of the waveguide layers, preferably in the first waveguide layer, is advantageous because this results in a favorable intensity profile of the fundamental mode and thus in a low lasing threshold. On the one hand, the inventive design ensures that the fundamental mode is outside the active layer. However, if the fundamental mode were too far away from the active layer, the lasing threshold would increase sharply so that forming a refractive-index gradient especially results in an optimal positioning of the fundamental mode in the waveguide.

In a particularly preferred embodiment, the first waveguide layer and the second waveguide layer have a refractive-index gradient (by varying the aluminum content along the layer thickness), wherein the aluminum content is varied between 15% and 85% in the second waveguide layer and between 15% and 20% in the first waveguide layer.

If there is a refractive-index gradient, the refractive index preferably changes linearly from one side to the other side.

Preferably, the first waveguide layer and the second waveguide layer are made of the same material.

Preferably, the active layer, the first cladding layer, the second cladding layer, the first waveguide layer and the second waveguide layer are designed in such a manner that the maximum mode intensity of the fundamental mode is in a region outside the active layer.

Preferably, a carrier substrate is provided, on which the above-mentioned layer structure is built up. Preferably, the n-conducting layers are arranged on that side of the active layer which faces the carrier substrate, whereas the p-conducting layers are arranged on that side of the active layer which faces away from the carrier substrate. Preferably, the diode laser has contact layers for charge carrier injection.

BRIEF DESCRIPTION OF THE DRAWINGS

In the following, the invention will be explained in greater detail on the basis of exemplary embodiments. In the figures.

DETAILED DESCRIPTION OF THE DRAWINGS

Figure 1:
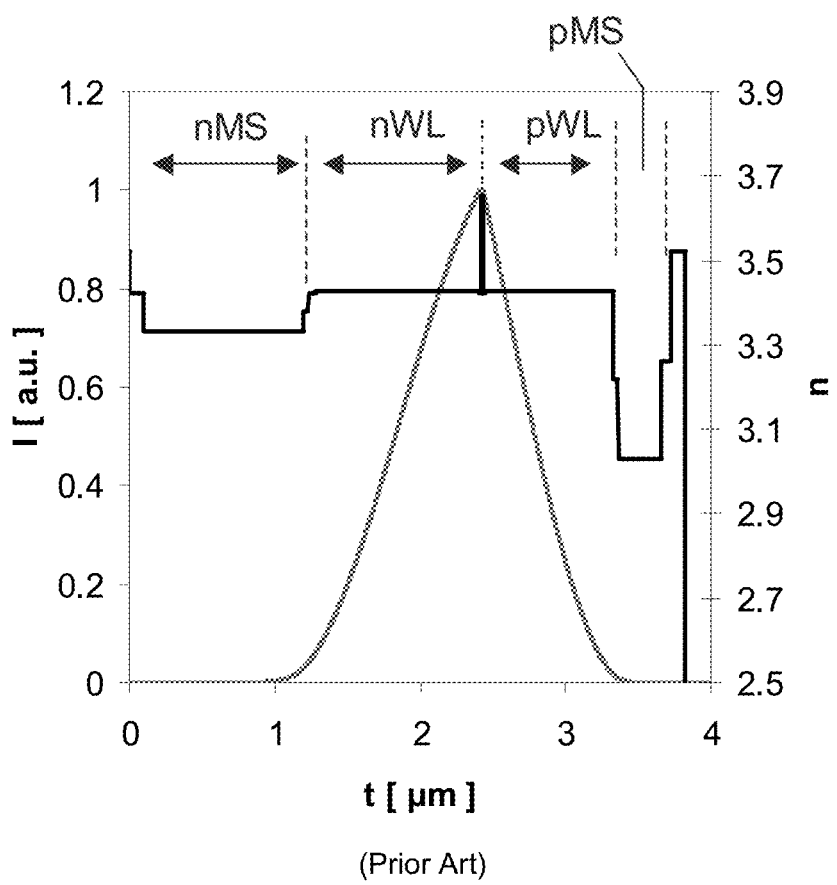
FIG. 1 shows the distribution of refractive indices along the layers of a conventional prior-art laser diode and the vertical distribution of mode intensity in the laser diode related thereto.

FIG. 1 shows the distribution of refractive indices along the layers of a conventional prior-art laser diode and the vertical distribution of mode intensity in the laser diode related thereto. As discussed in the introductory part of the description, optical loss and non-reactive resistance are dominated by the p-conducting waveguide layer pWL. On account of the high optical loss and the high non-reactive resistance, the efficiency of the diode laser is reduced considerably.

Figure 2A:
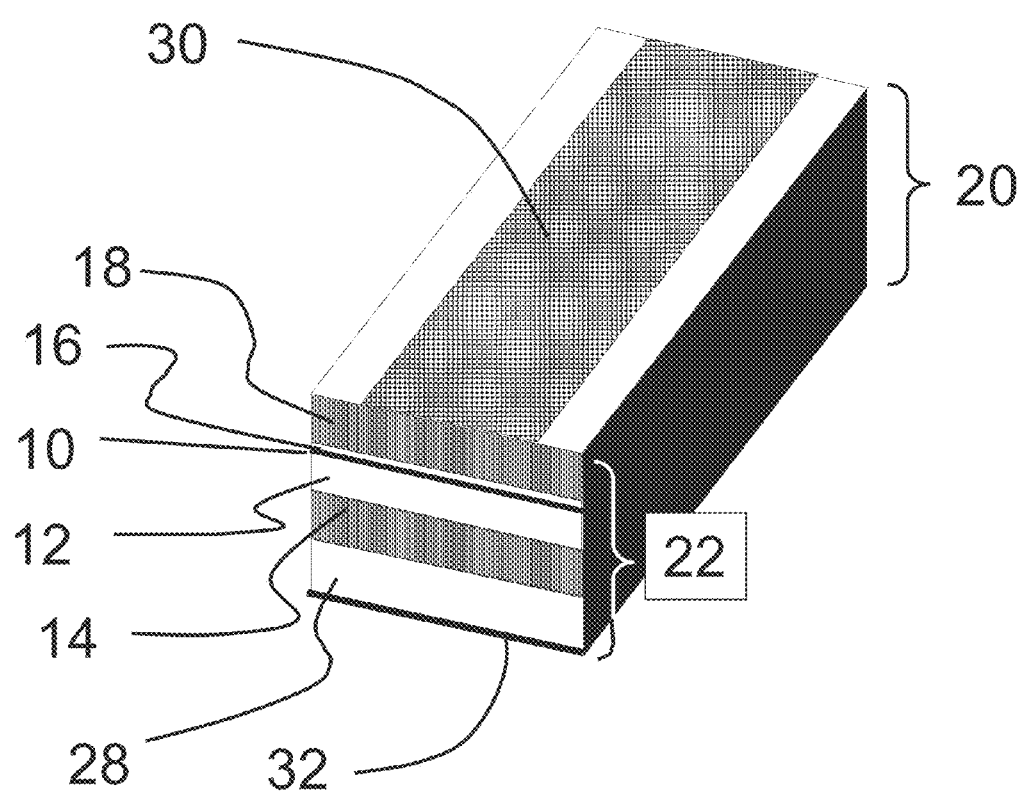
FIG. 2A shows a schematic perspective representation of an inventive laser diode.
Figure 2B:
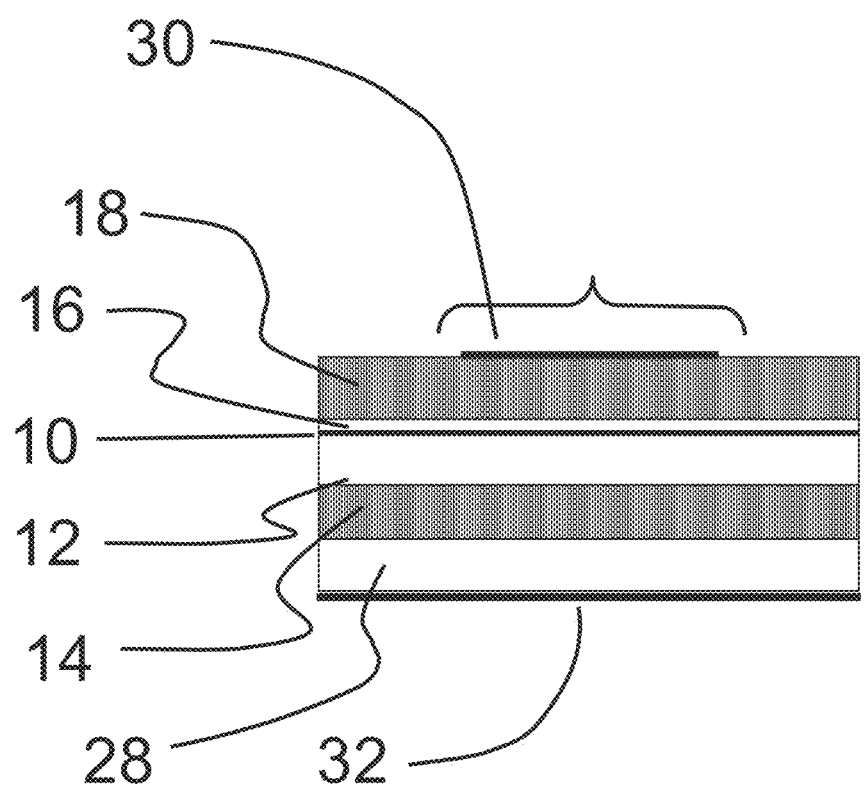
FIG. 2B shows a schematic sectional view of the inventive laser diode of FIG. 2A along an axis across the direction of light propagation.
Figure 2C:
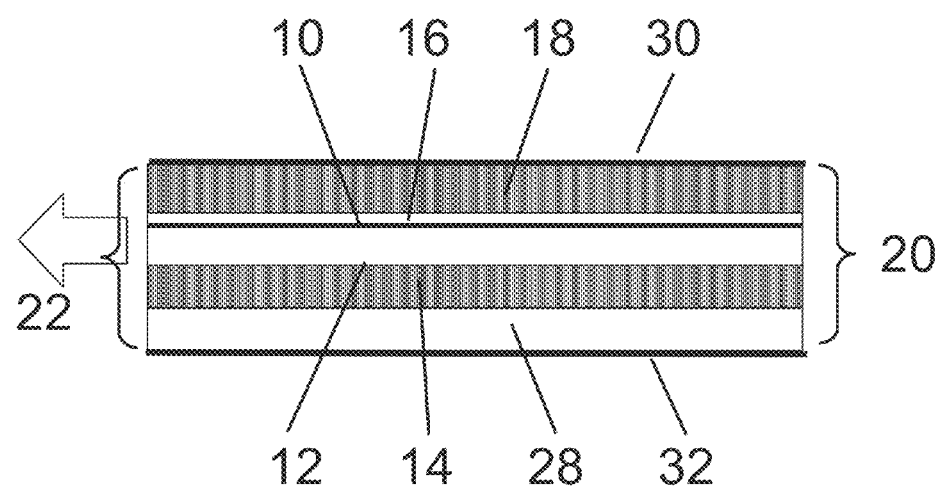
FIG. 2C shows a schematic sectional view of the inventive laser diode of FIG. 2A along an axis parallel to the direction of light propagation.

FIG. 2A to FIG. 2C show a perspective representation and sectional views of an inventive laser diode.

The inventive laser diode has a vertical layer structure with a substrate 28, a first n-conducting cladding layer 14 arranged on the substrate 28, a first n-conducting waveguide layer 12 arranged on the cladding layer 14, an active layer 10 arranged on the waveguide layer 12, a second p-conducting waveguide layer 16 arranged on the active layer 10, and a second p-conducting cladding layer 18 arranged on the waveguide layer 16.

Furthermore, the inventive laser diode has, at the lateral, opposite ends thereof, a reflecting facet 20 having a high reflectivity for the central wavelength of the radiation emitted by the active layer 10 and an exit facet 22 having a reflectivity that enables the radiation to be decoupled. Preferably, the reflectivity of the reflecting facet 20 is higher than 0.8, even more preferably higher than 0.9, and even more preferably higher than 0.99. The reflectivity of the exit facet 22 is lower than the reflectivity of the reflecting facet 20.

Furthermore, the inventive laser diode has contacts 30 and 32 for charge carrier injection. By means of the structure formed in this way, charge carriers having a first polarity can get into the active layer 10 via the first contact 30, the first cladding layer 14 (here n-conducting) and the first waveguide layer 12 (here n-conducting) and charge carriers having the opposite polarity can also get into the active layer 10 via the second contact 32, the second cladding layer 18 (here p-conducting) and the second waveguide layer 16 (here p-conducting) and recombine there, whereby an emission is caused. The facets 20 and 22 form a cavity so that the laser can be operated.

The concrete structure of the preferred exemplary embodiment shown in FIG. 2A to FIG. 2C is a diode laser having an active layer 10 with a central emission wavelength of 975 nm made of an InGaAs double quantum well. The cladding layers and waveguide layers 12, 14, 16, 18 are made of $Al(x)Ga(1-x)As$. For the waveguides 12, 16, x in $Al(x)Ga(1-x)As$ is preferably 15% (0.15). For the cladding layers 14, 18, x in $Al(x)Ga(1-x)As$ is preferably 85% (0.85). In the preferred exemplary embodiment, the layer thickness of the n-conducting cladding layer 14 is 2000 nm, the layer thickness of the n-conducting waveguide layer 12 is 1100 nm, the layer thickness of the p-conducting waveguide layer 16 is 50 nm, and the layer thickness of the p-conducting cladding layer 18 is 900 nm.

In an alternative preferred embodiment, the p-conducting waveguide layer 16 has a composition profile, i.e., x continuously (infinitely) varies between 15% and 85% from the junction to the active layer 10 to the cladding layer 18. In this alternative preferred exemplary embodiment, the layer thickness of the n-conducting cladding layer 14 is 2000 nm, the layer thickness of the n-conducting waveguide layer 12 is 1100 nm, the layer thickness of the p-conducting waveguide layer 16 is 100 nm, and the layer thickness of the p-conducting cladding layer 18 is 900 nm.

In a particularly preferred embodiment, the first waveguide layer and the second waveguide layer have a refractive-index gradient (by varying the aluminum content along the layer thickness), wherein the aluminum content is varied between 15% and 85% in the second waveguide layer and between 15% and 20% in the first waveguide layer.

Figure 3:
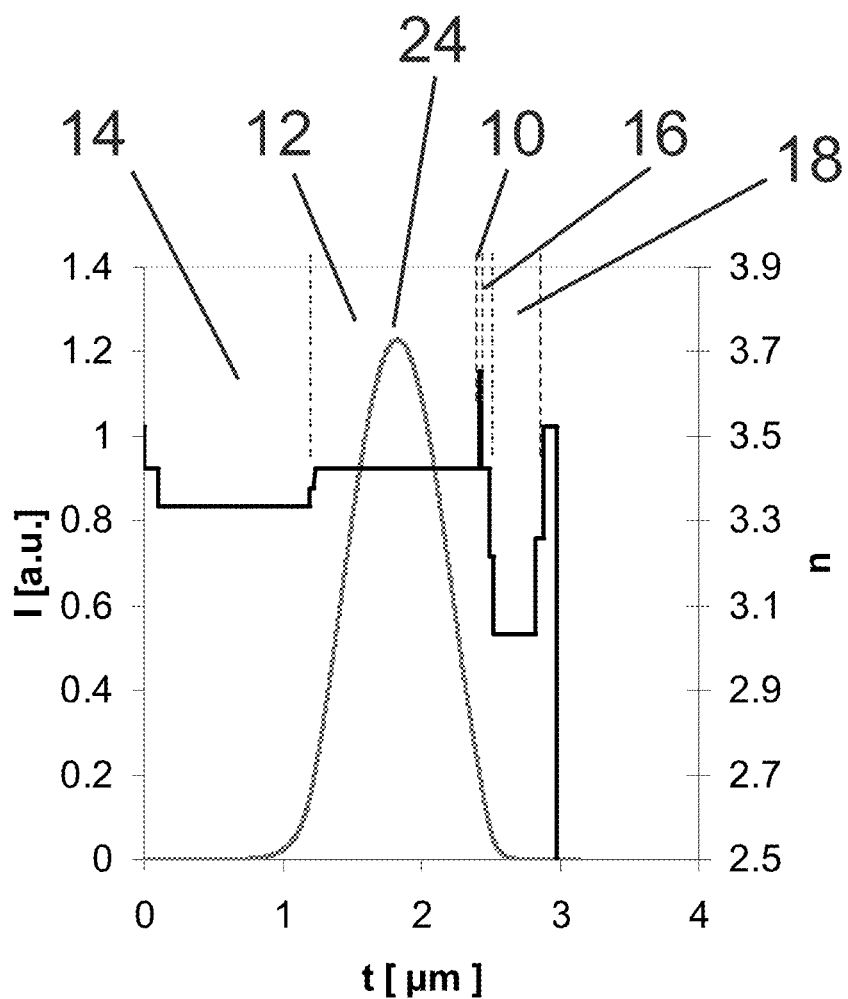
FIG. 3 shows the distribution of refractive indices along the layers of the inventive laser diode and the vertical distribution of mode intensity related thereto.

FIG. 3 shows the distribution of refractive indices (refractive index n) of the layers 10, 12, 14, 16 and 18 along a vertical axis with symmetrical waveguide layers and the vertical distribution of the mode intensity I of the fundamental mode 24 related thereto, wherein t indicates the exact vertical positions (depth) of the individual layers 10, 12, 14, 16 and 18 along the vertical axis. One can see clearly that the maximum mode intensity of the fundamental mode 24 is shifted to a region outside the active layer 10 by means of the inventive structure so that the lower limit to the attainable minimum of optical loss/the attainable minimum of non-reactive resistance is not as high as in the prior art.

Figure 4:
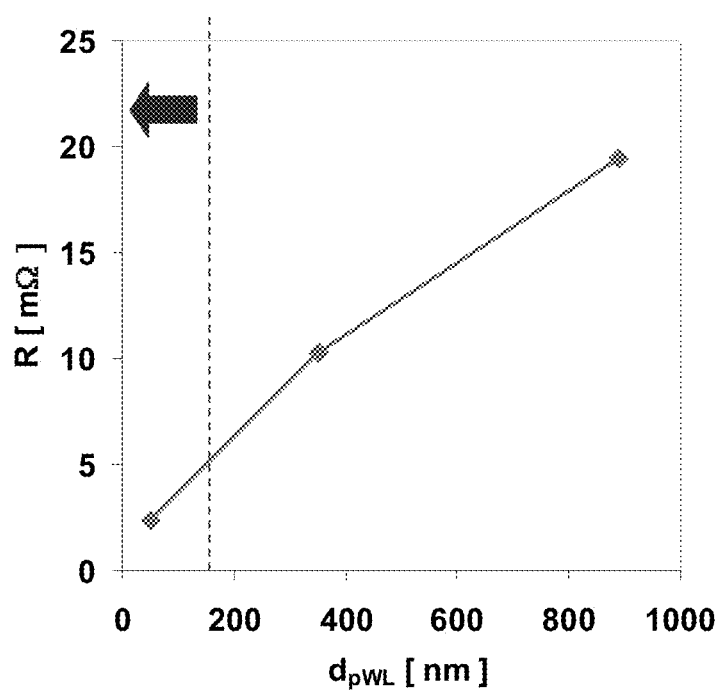
FIG. 4 shows the dependency of non-reactive resistance on the layer thickness of the p-conducting waveguide layer.
Figure 5:
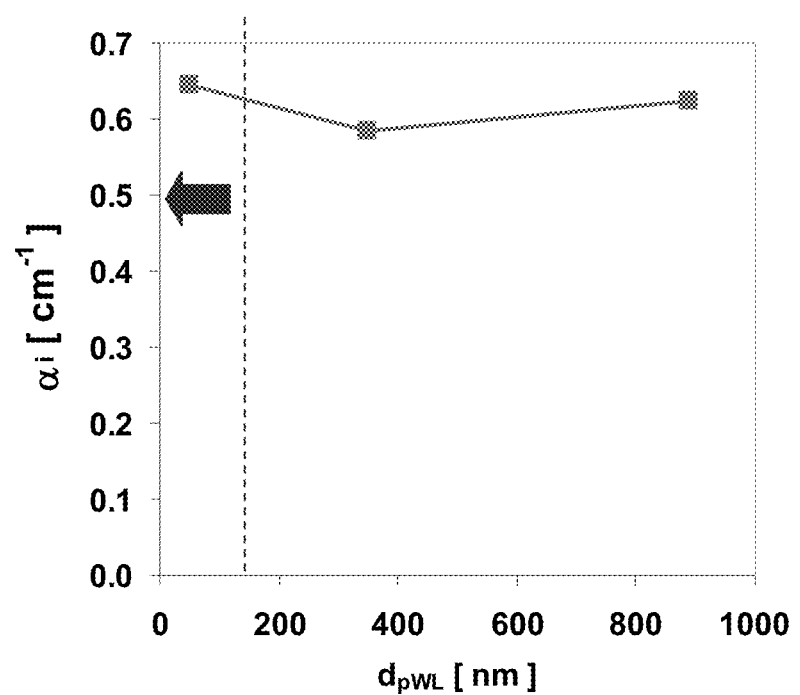
FIG. 5 shows the dependency of optical loss on the layer thickness of the p-conducting waveguide layer.

FIG. 4 shows the dependency of non-reactive resistance on the layer thickness $d_{pWL}$ of the p-conducting waveguide layer 16 and FIG. 5 shows the dependency of optical loss on the layer thickness $d_{pWL}$ of the p-conducting waveguide layer 16. One can see clearly that non-reactive resistance can be reduced considerably by using a smaller layer thickness of the p-conducting waveguide layer 16.

The values for FIG. 4 and FIG. 5 were calculated without any changes in the doping profile. Furthermore, a tailor-made doping profile results in a reduction of optical loss as against the values in FIG. 5. The waveguide layers and cladding layers of the structure that is finally optimized according to the invention have the following non-reactive resistance values: n-conducting cladding layer 14 2.3 mΩ, n-conducting waveguide layer 12 2.8 mΩ, p-conducting waveguide layer 16 2.2 mΩ, and p-conducting cladding layer 18 1.3 mΩ. Furthermore, the waveguide layers and cladding layers of said structure have the following optical loss values: n-conducting cladding layer 14 about 0.00 $cm^{-1}$, n-conducting waveguide layer 12 about 0.08 $cm^{-1}$, p-conducting waveguide layer 16 about 0.00 $cm^{-1}$, and p-conducting cladding layer 18 about 0.05 $cm^{-1}$. The use of the inventive design results in the fact that non-reactive resistance and optical loss are not dominated by the p-conducting waveguide layer 16 any more and therefore in a considerable reduction of non-reactive resistance and optical loss.

Figure 6:
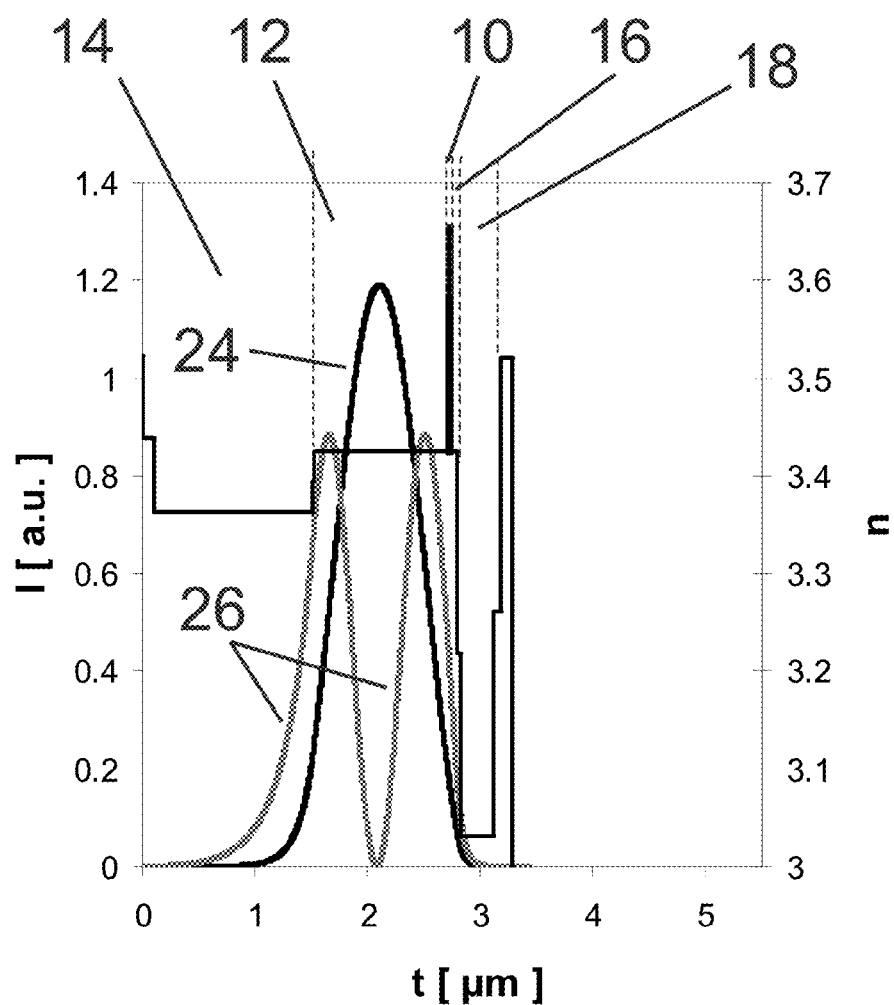
FIG. 6 shows the distribution of refractive indices along the layers of the inventive laser diode and the vertical distribution of mode intensity related thereto for the fundamental mode and two higher-order modes with the layer thicknesses of the n-conducting waveguide layer and of the n-conducting cladding layer being almost the same.
Figure 7:
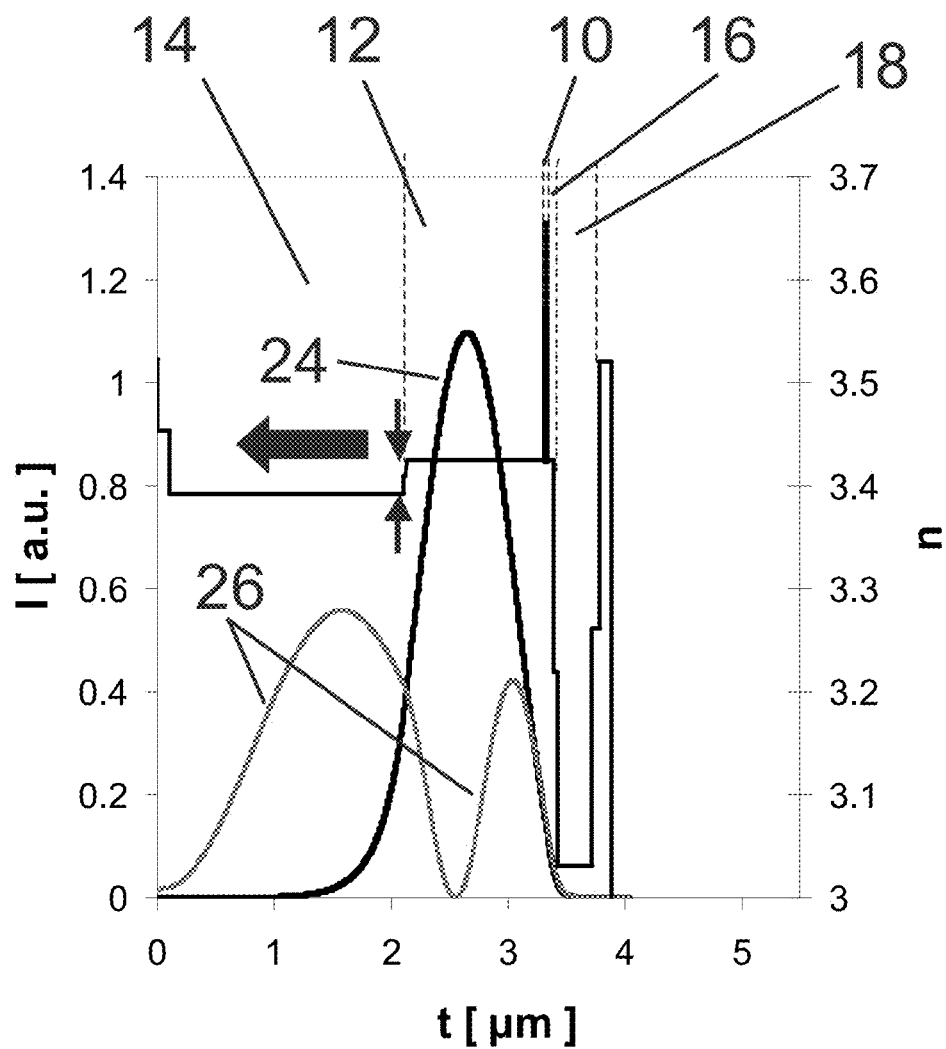
FIG. 7 shows the distribution of refractive indices along the layers of the inventive laser diode and the vertical distribution of mode intensity related thereto for the fundamental mode and two higher-order modes with the n-conducting cladding layer being widened.
Figure 8:
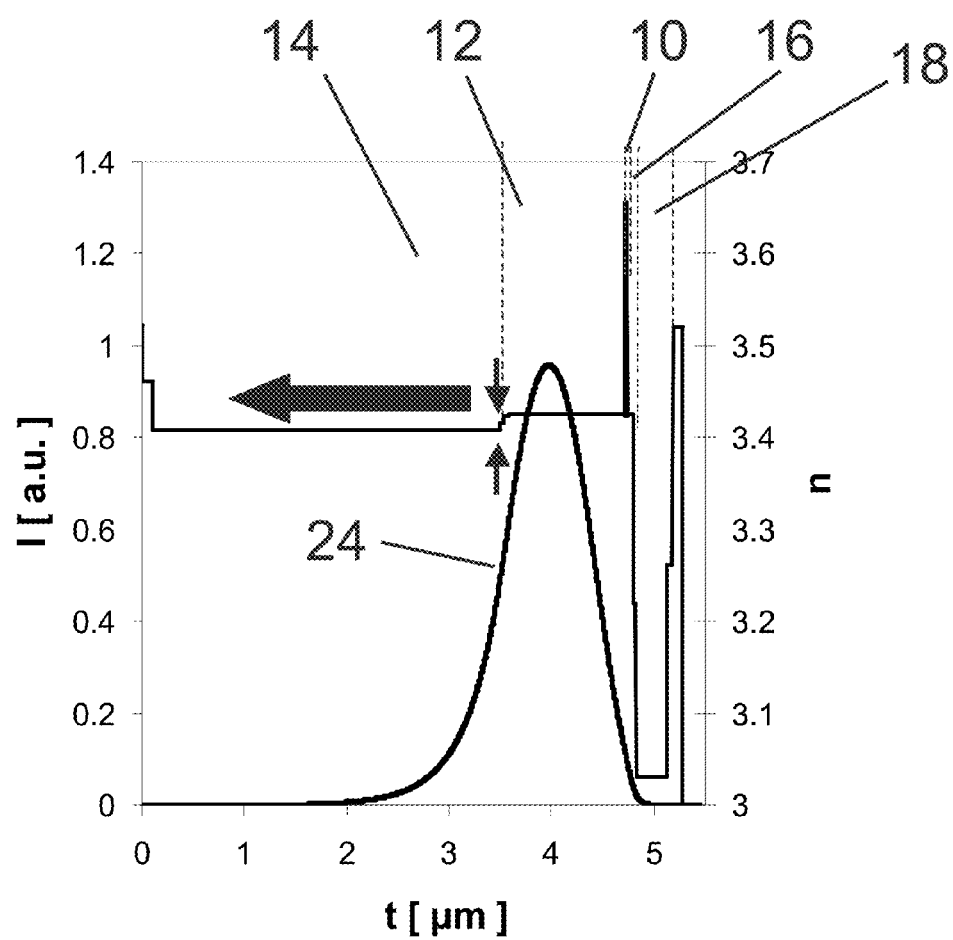
FIG. 8 shows the distribution of refractive indices along the layers of the inventive laser diode and the vertical distribution of mode intensity related thereto for the fundamental mode and two higher-order modes with the n-conducting cladding layer being widened considerably.

FIG. 6 to FIG. 8 show the distribution of refractive indices along the layers 10, 12, 14, 16 and 18 of the inventive laser diode and the vertical distribution of mode intensity related thereto for the fundamental mode 24 and second higher-order modes 26 with the layer thicknesses of the n-conducting waveguide layer 12 and of the n-conducting cladding layer 14 being almost the same. In the exemplary embodiment of FIG. 6, the layer thickness of the n-conducting cladding layer 14 is 1000 nm and the layer thickness of the n-conducting waveguide layer 12 is 1200 nm. FIG. 6 clearly shows that the higher-order mode 26 which is closer to the active layer 10 has a higher gain than the fundamental mode 24 (since the maximum mode intensity of the fundamental mode 24 has been shifted to a region outside the active layer 10) so that the quality of laser irradiation (lateral energy distribution in particular) is reduced. In order to reduce or completely suppress the stimulation of higher-order modes 26, the invention provides keeping the refractive-index difference between the n-conducting cladding layer 14 and the n-conducting waveguide layer 12 small.

At the same time, the n-conducting cladding layer is extended in order to prevent the fundamental mode from being coupled to the substrate. In FIG. 6, the refractive-index difference ($\Delta n$) is 0.009. In the exemplary embodiment of FIG. 7, the difference ($\Delta n$) between the refractive index of the first waveguide layer and the refractive index of the first cladding layer is 0.0065 and the layer thickness of the first (n-conducting) cladding layer is 2000 nm. This thickness is sufficient to prevent, for this $\Delta n$ and the layer thickness of the first (n-conducting) waveguide layer of 1100 nm, the fundamental mode from being coupled to the substrate modes. In the exemplary embodiment of FIG. 8, the difference ($\Delta n$) between the refractive index of the first waveguide layer and the refractive index of the first cladding layer is 0.0035. Therefore, the layer thickness of the first (n-conducting) cladding layer must be 3000 nm in order to prevent, for this $\Delta n$, the fundamental mode from being coupled to the substrate modes.

Figure 9:
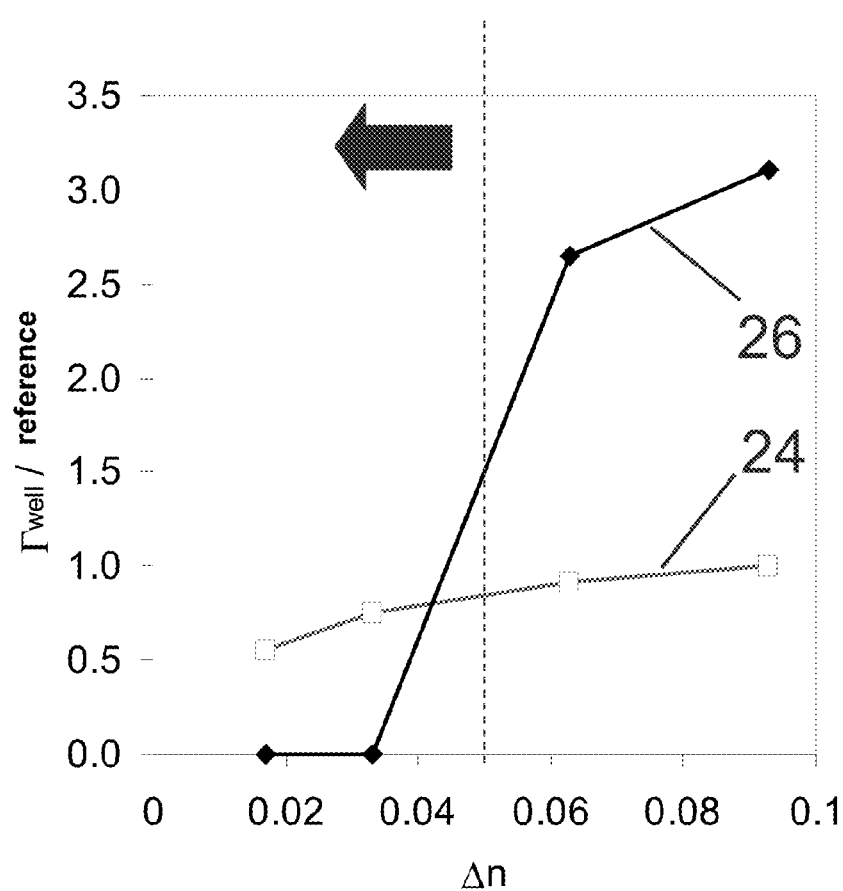
FIG. 9 shows the dependency of the proportion of the radiation energy $\Gamma_{WELL}$ in the active layer with respect to a reference radiation energy on the refractive-index difference between the n-conducting waveguide layer and the n-conducting cladding layer.

FIG. 9 shows the dependency of the proportion of the radiation energy $\Gamma_{WELL}$ in the active layer 10 with respect to a reference radiation energy on the refractive-index difference $\Delta n$ between the n-conducting waveguide layer 12 and the n-conducting cladding layer 14. One can see that the intensity of the higher-order modes 26 drops much more sharply than the intensity of the fundamental mode 24 with decreasing refractive-index difference $\Delta n$. Therefore, the higher-order modes 26 can be suppressed or eliminated by selecting a suitable refractive-index difference ($\Delta n<0.05$).

LIST OF REFERENCE NUMERALS 10 active layer
12 first waveguide layer (n-conducting)
14 first cladding layer (n-conducting)
16 second waveguide layer (p-conducting)
18 second cladding layer (p-conducting)
20 reflecting facet
22 exit facet
24 fundamental mode
26 higher-order mode
28 substrate
30 contact for charge carrier injection
32 contact for charge carrier injection

The invention claimed is:

1. A diode laser having:
a first n-conducting cladding layer,
a first n-conducting waveguide layer, which is arranged on the first cladding layer,
an active layer, which is suitable for generating radiation and which is arranged on the first waveguide layer,
a second p-conducting waveguide layer, which is arranged on the active layer, and
a second p-conducting cladding layer, which is arranged on the second waveguide layer,
wherein the sum of the layer thickness of the first waveguide layer, the layer thickness of the active layer and the layer thickness of the second waveguide layer is greater than 1 µm and the layer thickness of the second waveguide layer is less than 150 nm,
wherein
the active layer, the first cladding layer, the second cladding layer, the first waveguide layer and the second waveguide layer are designed in such a manner that the maximum mode intensity of the fundamental mode is in a region outside the active layer, and wherein the difference between the refractive index of the first waveguide layer and the refractive index of the first cladding layer is between 0.04 and 0.01.

2. The diode laser according to claim 1,
wherein
the layer thickness of the active layer is less than 80 nm.

3. The diode laser according to claim 1
wherein
the active layer at least one quantum well and the ratio that the sum of the thicknesses of the at least one quantum well bears to the optical confinement factor ($\Gamma$) is less than 4 µm.

4. The diode laser according to claim 1,
wherein
the active layer has at least one well layer.

5. The diode laser according to claim 1,
wherein
the layer thickness of the second waveguide layer is less than 100 nm.

6. The diode laser according to claim 1,
wherein
at least one of the waveguide layers has a refractive-index gradient.

7. The diode laser according to claim 1,
wherein
the layer thickness of the first cladding layer is greater than 1 µm.

8. The diode laser according to claim 1,
wherein
the ratio that the layer thickness of the first cladding layer bears to the layer thickness of the first waveguide layer is greater than 1.5.

9. The diode laser according to claim 7,
wherein
the ratio that the layer thickness of the first cladding layer bears to the layer thickness of the first waveguide layer is greater than 1.7.

10. The diode laser according to claim 1,
wherein
a reflecting facet for reflecting the radiation emitted by the active layer and an exit facet for reflecting and decoupling the radiation emitted by the active layer are provided, wherein both the reflecting facet and the exit facet are arranged in the edge region of the active layer and wherein the reflecting facet and the exit facet are arranged opposite each other with respect to the active layer.

11. The diode laser according to claim 1,
wherein
the active layer has at least one quantum well.

12. The diode laser according to claim 1,
wherein
the diode laser is designed as an edge-emitting diode laser or as an optical amplifier.

13. The diode laser according to claim 1, wherein
the diode laser is designed as a CW diode laser.

\* \* \* \* \*